United States Patent [19]
Sugioka et al.

[11] Patent Number: 5,733,823
[45] Date of Patent: Mar. 31, 1998

[54] PREPREG FOR PRINTED CIRCUIT BOARD AND SUBSTRATE FOR PRINTED CIRCUIT USING SAID PREPREG

[75] Inventors: Taizou Sugioka; Shinobu Yamao, both of Ichihara, Japan

[73] Assignee: Idemitsu Petrochemical Co., Ltd., Tokyo, Japan

[21] Appl. No.: 706,691

[22] Filed: Sep. 6, 1996

[30] Foreign Application Priority Data

Sep. 12, 1995 [JP] Japan .................... 7-233613

[51] Int. Cl.$^6$ ................ B32B 7/00; B32B 17/10
[52] U.S. Cl. .............. 442/110; 442/111; 442/117; 442/136; 442/236; 428/415; 428/416; 428/432; 428/436; 428/458; 428/477.4; 428/530; 428/901; 174/121 R; 524/494; 525/71; 525/74; 525/207; 525/208; 525/241
[58] Field of Search .............. 524/494; 525/71, 525/74, 207, 208, 241; 442/110, 111, 117, 136, 236; 428/415, 416, 432, 436, 458, 477.4, 530, 901; 174/121 R

[56] References Cited

U.S. PATENT DOCUMENTS 5,436,397  7/1995  Okada ................... 524/494

*Primary Examiner*—Richard Weisberger
*Attorney, Agent, or Firm*—Oblon, Spivak, McClelland, Maier & Neustadt, P.C.

[57] ABSTRACT

There are provided a prepreg for a printed circuit board which comprises a glass cloth impregnated with a flame retardative resin composition comprising a (A) resin composed of a (a) styrenic polymer having syndiotactic configuration, a (b) polymer having compatibility with or affinity for the component (a) and further containing polar group, and a (c) thermoplastic resin other than the components (a) and (b) and/or a rubbery elastomer; a (B) halogenated polystyrene in which the amount of halogen atoms contained in halogen compounds generated under specific conditions is at most 1000 ppm by weight; a (C) flame retardant aid; an (D) organic filler or inorganic filler; and the above glass cloth, and also a substrate for printed circuit which comprises the prepreg or a laminate comprising a plurality of the prepregs laminated on each other, at least one side of the prepreg or laminate being laminated with a metallic layer. The above substrate is greatly improved in resistance to electrolytic corrosion and imparted with high reliability, and thus can cope with high density commercial devices.

15 Claims, No Drawings

PREPREG FOR PRINTED CIRCUIT BOARD AND SUBSTRATE FOR PRINTED CIRCUIT USING SAID PREPREG

BACKGROUND OF THE INVENTION

1. Field of the Invention

The present invention relates to a prepreg for a printed circuit board and a substrate for printed circuit using said prepreg. More particularly it pertains to a prepreg for a printed circuit board which is well suited for the production of a printed circuit board excellent in resistance to electrolytic corrosion and highly reliable and a substrate for printed circuit using said prepreg.

2. Description of Related Arts

In general, the phenomenon of electrolytic corrosion in a printed circuit board arising from leakage current and/or stay current takes place in the case where a conductor metal forming a circuit or the residue of a metal which was used at the time of forming a conductor, or the like is ionized in a state that voltage is impressed under a high humidity condition; or a slight amount of a hydrolyzable substance such as a chloride or sulfide which is contained in a resin, etc. to be used forms an acid or alkali, whereby the solution of an electrolyte is produced. It is known that the above-mentioned phenomenon of electrolytic corrosion is more apt to take place in the case where such a metal as silver, gold, copper, tin, platinum, palladium or aluminum is used in a printed circuit board and that the phenomenon is concerned with alkali metal ions, halogenide ions, copper foils and a surface treated metal that are used in the production step of a laminate, ions that are present in a laminate, the amount of moisture absorbed in a laminate and the like.

As a method for preventing electrolytic corrosion in the aforementioned printed circuit board, there have heretofore been available (1) a method in which the ionization of a conductor metal in a printed circuit board is prevented; (2) a method in which generated ions are immobilized; (3) a method in which generated ions are insolubilized by means of a precipitant; (4) a method in which generated ions are immobilized by means of a chelating agent or a completing agent; and (5) a method in which hydroxyl ions etc. present on the surface of a laminate are inactivated. These methods are each put into practice by the alloying of a conductor metal, the addition of any of various additives, or the surface treatment of glass fiber or a filler. The actual situation is, however that sufficient characteristic resistance to electrolytic corrosion is not yet achieved for a recent highly densified printed circuit board.

SUMMARY OF THE INVENTION

The present invention has been accomplished in the light of the above-mentioned circumstances. Specifically it is a general objection of the present invention to overcome the disadvantages of the conventional printed circuit board, and thereby provide a flame resistant substrate for printed circuit excellent in characteristic resistance to electrolytic corrosion, highly reliable and capable of coping with a highly densified commercial apparatus by decreasing ions and moisture that are present in a laminate; and at the same time, provide a prepreg suitable for a printed circuit board to be used in the aforesaid substrate.

Under such circumstances, intensive research and investigation were accumulated by the present inventors in order to develop the flame resistant substrate for printed circuit substrate imparted with favorable characteristics as mentioned before as well as a prepreg for a printed circuit board to be used for the substance. As a result, it has been found that the above-mentioned object is achieved by employing, as a flame retardant, a flame retardative resin composition comprising a specific halogenated polystyrene. The present invention has been accomplished on the basis of such finding and information.

Specifically, the present invention provides a prepreg for a printed circuit board which comprises 5 to 99% by weight of a flame retardative resin composition and 1 to 95% by weight of a glass cloth impregnated therewith, said resin composition comprising 100 parts by weight of a (A) resin composed of 10 to 100% by weight of a (a) styrenic polymer having syndiotactic configuration, 0 to 10% by weight of a (b) polymer having compatibility with or affinity for said component (a) and further containing a polar group, and 0 to 90% by weight of a (c) thermoplastic resin other than said components (a) and (b) and/or a rubbery elastomer; 2 to 100 parts by weight of a (B) halogenated polystyrene in which the amount of halogen atoms contained in halogen compounds generated at the time when said polystyrene is allowed to stand in an atmosphere of 300° C. for 15 minutes is at most 1000 ppm by weight based on the total amount of halogen atoms contained in said halogenated polystyrene; a (C) flame retardant aid in a proportion of 1 to 10 expressed in terms of the component (B)/the component (C); and 0 to 350 parts by weight of an (D) organic filler or inorganic filler. At the same time, it provides a substrate for printed circuit which comprises said prepreg or a laminate comprising a plurality of said prepregs laminated on each other, at least one side of said prepreg or said laminate being laminated with a metallic layer.

DESCRIPTION OF PREFERRED EMBODIMENT

In the flame retardative resin composition constituting the prepreg for a printed circuit board according to the present invention, there is used a styrenic polymer having syndiotactic configuration (hereinafter sometimes referred to as "SPS") as the component (a) in (A).

Here, the syndiotactic configuration in the styrenic polymer which has syndiotactic configuration means that its stereochemical structure is of syndiotactic configuration, i.e., the stereostructure in which phenyl groups or substituted phenyl groups as side chains are located alternately at opposite directions relative to the main chain consisting of carbon-carbon bonds. Tacticity is quantitatively determined by the nuclear magnetic resonance method ($^{13}$C-NMR method) using carbon isotope. The tacticity as determined by the $^{13}$C-NMR method can be indicated in terms of proportions of structural units continuously connected to each other, i.e., a diad in which two structural units are connected to each other, a triad in which three structural units are connected to each other and a pentad in which five structural units are connected to each other. The styrenic polymers having such syndiotactic configuration as mentioned in the present invention usually means polystyrene, poly(alkylstyrene), poly(halogenated styrene), poly (halogenated alkylstyrene), poly(alkoxystyrene), poly(vinyl benzoate), hydrogenated polymer thereof, the mixture thereof, and copolymers containing the above polymers as main components, having such a syndiotacticity as determined by the above-mentioned method that the proportion of racemic diad is at least 75%, preferably at least 85%, or the proportion of racemic pentad is at least 30%, preferably at least 50%. The poly(alkylstyrene) includes poly (methylstyrene), poly(ethylstyrene), poly(isopropylstyrene), poly(tert-butylstyrene), poly(phenylstyrene), poly (vinylnaphthalene) and poly(vinylstyrene). Poly (halogenated styrene) includes poly(chlorostyrene), poly (bromostyrene), and poly(fluorostyrene). Poly(halogenated alkylstyrene) includes poly(chloromethylstyrene). Poly (alkoxystyrene) includes poly(methoxystyrene), and poly (ethoxystyrene).

The particularly desirable styrenic polymers are polystyrene, poly(p-methylstyrene), poly(m-methylstyrene), poly(p-tert-butylstyrene), poly(p-chlorostyrene), poly(m-chlorostyrene), poly(p-fluorostyrene), hydrogenated polystyrene and the copolymer containing the structural units thereof.

The above-mentioned styrenic polymer may be used alone or in combination with at least one other.

The molecular weight of the styrenic polymer to be used in the present invention is not specifically limited, but is desirably 10,000 or more, more desirably 50,000 or more in terms of weight-average molecular weight. The molecular-weight distribution, that is, the broadening of molecular weight of the styrenic polymer is not specifically limited as well, but may be in a wide range. A weight-average molecular weight of less than 10,000 is unfavorable since the composition or molding obtained therefrom is sometimes deteriorated thereby in the thermal and mechanical properties.

The styrenic polymer having such syndiotactic configuration can be produced by polymerizing a styrenic monomer which corresponds to the above styrenic polymer in the presence or absence of a solvent such as an inert hydrocarbon by the use of a catalyst comprising a titanium compound and a condensation product of water and trialkylaluminum (Japanese Patent Application Laid-Open No. 187708/1987). In addition, the poly(halogenated alkylstyrene) and the hydrogenated product thereof can be produced by the processes described in Japanese Patent Application Laid-Open Nos. 46912/1989 and 178505/1989, respectively.

In the resin composition (A) of the present invention, the component (a) may be blended, when necessary, with the component (b), that is, a polymer having compatibility with or affinity for the above-described component (a) and further containing a polar group, and/or with the component (c), that is, a thermoplastic resin other than said components (a) and (b) and/or a rubbery elastomer.

The component (b), that is, the polymer having compatibility with or affinity for the component (a) is imparted with the function of enhancing the adhesivity of the organic filler or the inorganic filler onto the resin.

Here, the polymer having compatibility with or affinity for the component (a) and further containing a polar group is a polymer which contains in its chain, a chain exhibiting compatibility with or affinity for the component (a), and is exemplified by a polymer containing syndiotactic polystyrene, atactic polystyrene, isotactic polystyrene, styrenic polymer, poly(phenylene ether), poly(vinyl ethyl ether) or the like as its main chain, block chain or graft chain.

The polar group as mentioned above need only be a polar group which enhances the adhesivity to the above-mentioned organic filler or inorganic filler and specifically exemplified, without specific limitation, by a group of any of acid anhydride, carboxylic acid, carboxylic acid ester, carboxylic acid halide, carboxylic acid amide, carboxylate, sulfonic acid, sulfonic acid ester, sulfonic acid chloride, sulfonic acid amide and sulfonate, epoxy group, amino group, imide group and oxazoline group.

Specific examples of the component (b) include styrene/maleic anhydride copolymer (SMA), styrene/glycidyl methacrylate copolymer, carboxylic acid end-modified polystyrene, epoxy group end-modified polystyrene, oxazoline end-modified polystyrene, amine end-modified polystyrene, sulfonated polystyrene, styrenic ionomer, styrene/methyl methacrylate graft copolymer, (styrene/glycidyl methacrylate)/methyl methacrylate graft copolymer, acid modified acrylate/styrene graft copolymer, (styrene/glycidyl methacrylate)/styrene graft copolymer, polybutylene terephthalate/polystyrene graft copolymer, modified styrenic polymer such as maleic anhydride modified SPS, fumaric acid modified SPS, glycidyl methacrylate modified SPS and amine-modified SPS, and modified poly(phenylene ether) such as (styrene/maleic anhydride)/poly(phenylene ether) graft copolymer, maleic anhydride modified poly(phenylene ether), fumaric acid modified poly(phenylene ether), glycidyl methacrylate modified poly(phenylene ether) and amine modified poly(phenylene ether).

Of these, modified SPS and modified poly(phenylene ether) are particularly preferable.

The above-mentioned polymer may be used alone or in combination with at least one other.

The aforesaid modified styrenic polymer and modified poly(phenylene ether) can be produced by modifying any of various styrenic polymers and poly(phenylene ether) by the use of a modifying agent. However, the production process is not limited to this process insofar as the modified product is usable for the object of the present invention.

The poly(phenylene ether) is a publicly known compound, and reference may be made to U.S. Pat. Nos. 3,306,874, 3,306,875, 3,257,357 and 3,257,358. The poly(phenylene ether) is prepared usually by oxidative coupling reaction forming a homopolymer or a copolymer in the presence of a cupramine complex and at least one di- or tri-substituted phenol. As the cupramine complex there may be used the cupramine complex derived from any of primary, secondary and tertiary amines.

Specific examples of the suitable poly(phenylene ether) include poly(2,3-dimethyl-6-ethyl-1,4-phenylene ether),
poly(2-methyl-6-chloromethyl-1,4-phenylene ether),
poly(2-methyl-6-hydroxyethyl-1,4-phenylene ether),
poly(2-methyl-6-n-butyl-1,4-phenylene ether),
poly(2-ethyl-6-isopropyl-1,4-phenylene ether),
poly(2-ethyl-6-n-propyl-1,4-phenylene ether),
poly(2,3,6-trimethyl-1,4-phenylene ether),
poly[2-(4'-methylphenyl)-1,4-phenylene ether],
poly(2-bromo-6-phenyl-1,4-phenylene ether),
poly(2-methyl-6-phenyl-1,4-phenylene ether),
poly(2-phenyl-1,4-phenylene ether),
poly(2-chloro-1,4-phenylene ether),
poly(2-methyl-1,4-phenylene ether),
poly(2-chloro-6-ethyl-1,4-phenylene ether),
poly(2-chloro-6-bromo-1,4-phenylene ether),
poly(2,6-di-n-propyl-1,4-phenylene ether),
poly(2-methyl-6-isopropyl-1,4-phenylene ether),
poly(2-chloro-6-methyl-1,4-phenylene ether),
poly(2-methyl-6-ethyl-1,4-phenylene ether),
poly(2,6-dibromo-1,4-phenylene ether),
poly(2,6-dichloro-1,4-phenylene ether),
poly(2,6-diethyl-1,4-phenylene ether) and
poly(2,6-dimethyl-1,4-phenylene ether).

There is also suitably used a copolymer such as a copolymer derived from at least two phenolic compounds that are used for preparing the above-mentioned homopolymer. Mention is further made for example, of a graft copolymer and a block copolymer each of an aromatic vinyl compound such as styrene and the aforesaid poly(phenylene ether). Among the above-mentioned poly(phenylene ether), poly(2,6-dimethyl-1,4-phenylene ether) is particularly preferably used.

As the modifying agent used for modifying the poly (phenylene ether), there is used a compound having an ethylenic double bond and a polar group in the same molecule, which is specifically exemplified by maleic anhydride, maleic acid, maleic acid ester, maleimide, N-substituted compound thereof, maleic acid derivatives typified by maleic acid salt, fumaric acid, fumaric acid ester, fumaric acid derivatives typified by fumaric acid salt, itaconic acid, itaconic acid ester, itaconic acid derivatives typified by itaconic acid salt, acrylic acid, acrylic acid ester, acrylic acid amide, acrylic acid derivatives typified by acrylic acid salt, methacrylic acid, methacrylic acid ester, methacrylic acid amide, methacrylic acid salt and methacrylic acid derivatives typified by glycidyl methacrylate, among which are preferably used maleic anhydride, fumaric acid, and glycidyl methacrylate in particular. The modifying agent may be used alone or in combination with at least one other.

The modified poly(phenylene ether) is obtained, for example, by reacting the above-mentioned starting poly (phenylene ether) with a modifying agent in the presence of a solvent or an other resin. There are available without specific limitation, publicly known methods such as a method wherein the poly(phenylene ether) and the modifying agent are melt kneaded at a temperature in the range of 150° to 300° C. to proceed with reaction by the use of a roll mill, Banbury mixer, extruder or the like, and a method in which the aforesaid components are reacted with heating in a solvent such as benzene, toluene, xylene or the like. In order to readily proceed with the reaction, it is effective to allow a radical generating agent to be present in the reaction-system which is exemplified by benzoyl peroxide, di-tert-butyl peroxide, dicumyl peroxide, tert-butyl peroxybenzoate, azobis(isobutyronitrile), azobis (isovaleronitrile) and 2,3-diphenyl-2,3-dimethylbutane. A preferable method is a method by melt kneading in the presence of a radical generating agent. Among the modified poly(phenylene ether) to be produced in the above manner, there are particularly preferably used maleic anhydride-modified poly(phenylene ether), fumaric acid-modified poly (phenylene ether) and glycidyl methacrylate-modified poly (phenylene ether).

There is also usable, as the component (b), a modified SPS containing a polar group, which is obtained by modifying the SPS to be used as the component (a) by the use of any of the modifying agents. The method for producing such a modified SPS, however, is not limited to the above-mentioned method insofar as it is usable for the object of the present invention.

In the case of preparing such modified SPS, the SPS as exemplified as the component (a) may be used as the starting SPS without specific limitation. There is preferably used however, a styrene/substituted styrene copolymer from the standpoint of compatibility with the other component. The compositional proportion in the copolymer is not specifically limited, but the proportion of the substituted styrene is preferably 3 to 50 mol %. A proportion thereof less than 3 mol % causes difficulty in modification, whereas that more than 50 mol % results in unfavorable deterioration of compatibility with the other component.

Examples of particularly preferable comonomer include alkylstyrenes such as methylstyrene, ethylstyrene, isopropylstyrene, tert-butylstyrene and vinylstyrene; halogenated styrenes such as chlorostyrene, bromostyrene and fluorostyrene; halogenated alkylstyrenes such as chloromethylstyrene; and alkoxystyrenes such as methoxystyrene and ethoxystyrene. The substituted styrene may be used alone or in combination with at least one other.

Polymers having atactic configuration can be used provided that the amount thereof to be used is not more than 5% by weight based on the SPS. An amount thereof more than 5% by weight unfavorably causes deterioration of the heat resistance of the resin composition.

As the modifying agent to be used for modifying the aforestated SPS, mention is made of modifying agents same as those exemplified in the description of the above-mentioned modified poly(phenylene ether), particularly preferably maleic anhydride, fumaric acid and glycidyl methacrylate. Any of the modifying agents may be used alone or in combination with at least one other. As the modifying method, there may be used modifying methods same as the methods for modifying the aforesaid poly (phenylene ether). Among the modified SPS to be produced in the above manner, there are particularly preferably used maleic anhydride-modified SPS, fumaric acid-modified SPS and glycidyl methacrylate-modified SPS.

In the present invention, the polymer as the component (b) may be used alone or in combination with at least one other. The content of the polar group in the polymer as the component (b) which has compatibility with or affinity for the component (a) and further contains a polar group is preferably in the range of 0.01 to 20% by weight, more preferably 0.05 to 10% by weight based on the polymer. A content thereof less than 0.01% by weight brings about the necessity for adding a large amount of the component (b) in order to exert the effect on the adhesion to the inorganic filler, thereby unfavorably deteriorating the dynamical properties and heat resistance of the resulting composition, whereas that more than 20% by weight causes unfavorable deterioration of the compatibility with the component (a). The content thereof is more preferably 0.05 to 10% by weight based thereon from the viewpoints of adhesivity to the inorganic filler or the like and the compatibility with the component (a).

In the thermoplastic resin other than the components (a) and (b) and/or a rubbery elastomer to be used as the component (c), examples of such thermoplastic resin include styrenic polymer such as polystyrene having atactic configuration, polystyrene having isotactic configuration, AS resin and ABS resin; polyester-based resin such as polyethylene terephthalate and polyethylene naphthalate; poly(thio)ether-based resin such as poly(phenylene ether), poly(phenylene sulfide) and poly(oxymethylene); polysulfone-based resin such as polysulfone and polyether; acrylic polymer such as poly(acrylic acid), poly(acrylic ester) and poly(methyl methacrylate); olefinic polymer such as polyethylene, polypropylene, polybutene, poly-4-methylpentene-1 and ethylene/propylene copolymer; halogenated vinylic polymer such as poly(vinyl chloride) and poly(vinylidene fluoride); and polyamide-based resin such as nylon 6, nylon 46 and nylon 66.

Examples of the rubbery elastomers to be used as the component (c) in combination with or in place of the above-mentioned thermoplastic resin include natural rubber, polybutadiene, polyisoprene, polyisobutylene, neoprene, polysulfide rubber, thiokol rubber, acrylic rubber, urethane rubber, silicone rubber, epichlorohydrin rubber, styrene/butadiene block copolymer (SBR), hydrogenated styrene/butadiene block copolymer (SEB), styrene/butadiene/styrene block copolymer (SBS), hydrogenated styrene/butadiene/styrene block copolymer (SEBS), styrene/isoprene block copolymer (SIR), hydrogenated styrene/isoprene block copolymer (SEP), styrene/isoprene/styrene block copolymer (SIS), hydrogenated styrene/isoprene/styrene block copolymer (SEPS), styrene/butadiene random copolymer, hydrogenated styrene/butadiene random copolymer, styrene/ethylene/propylene random copolymer, styrene/ethylene/butylene random copolymer, ethylene/propylene rubber (EPR), ethylene/propylene/diene rubber (EPDM) and a core shell type particulate elastomer such as butadiene/acrylonitrile/styrene core shell rubber (ABS), methyl methacrylate/butadiene/styrene core shell rubber (MBS), methyl-methacrylate/butyl-acrylate/styrene core shell rubber (MAS), octyl-acrylate/butadiene/styrene core shell rubber (MABS), alkyl-acrylate/butadiene/acrylonitrile/styrene core shell rubber (AABS), butadiene/styrene core shell rubber (SBR) and siloxane-containing core shell rubber such as methyl methacrylate/butyl acrylate/siloxane and a modified rubber obtained by modifying any of the above-mentioned copolymer or rubber. Of these, are preferably usable in particular, SBR, SBS, SEB, SEBS, SIR, SEP, SIS, SEPS, core shell rubber and rubber obtained by modifying any of the aforesaid rubber. The thermoplastic resin or the rubbery elastomer as the component (c) may be used alone or in combination with at least one other.

The blending proportion of each of the components in the component (A) contained in the above-mentioned flame retardative resin composition is such that the components (a), (b) and (c) are in the range of 10 to 100%, 0 to 10%, and 0 to 90%, respectively, each by weight based on the total amount of the aforesaid three components. A blending amount of the component (a) less than 10% by weight results in failure to sufficiently exhibit the characteristics of the SPS in the composition to be obtained, thus failing to achieve the object of the present invention. Preferably, the blending amount of the component (a) is in the range of 30 to 100% by weight, and more preferably it is in the range of 40 to 100% by weight in order that the SPS characteristics may be effectively manifested. A blending amount of the component (b) exceeding 10% by weight brings about deterioration of dynamical properties and solvent resistance in the composition to be obtained. In addition, a blending amount of the component (c) exceeding 90% by weight gives rise to failure to sufficiently exhibit the characteristics of the SPS in the composition to be obtained and deterioration of heat resistance, etc. Preferably, the blending amount of the component (c) is in the range of 0 to 70% by weight, and more preferably it is in the range of 0 to 60% by weight in order that the SPS characteristics may be effectively manifested.

In the flame retardative resin composition in the present invention, a halogenated polystyrene is employed as the component (B), which is imparted with the function as a flame retardant and is formed by substituting at least one halogen atom for at least one hydrogen atom inside and/or outside the benzene rings of polystyrene. It is known that, in this halogenated polystyrene, halogen atoms that are bonded to the portion outside benzene rings are eliminated at around 200° C. into a halogen compound and are evaporated away, whereas halogen atoms that are bonded to benzene rings are not eliminated even at around 300° C.

In the halogenated polystyrene as the component (B) in the present invention, the amount of halogen atoms contained in halogen compounds generated at the time when said polystyrene is allowed to stand in an atmosphere of 300° C. for 15 minutes is at most 1000 ppm by weight based on the total amount of halogen atoms contained in said polystyrene. An amount of halogen atoms therein exceeding 1000 ppm by weight brings about unfavorable events such as metallic corrosion at the time of molding the composition and the deterioration of retention stability for the composition. The amount of halogen atoms therein is preferably at most 800 ppm by weight, particularly preferably at most 600 ppm by weight from the viewpoints of anticorrosion and thermal stability. Examples of the halogenated polystyrene which satisfies the above-mentioned condition include a halogenated polystyrene in which halogen atoms are bonded substantially only to benzene rings, which signifies that the halogen atoms that are bonded to the portion outside benzene rings are permitted to be contained as impurities within the scope satisfying the aforestated condition. In addition, the content of halogen atoms in said halogenated polystyrene is preferably at least 30%, particularly preferably at least 40% each by weight in order that the flame retardative performance may favorably be exhibited. A preferable halogenated polystyrene is a brominated polystyrene in which all of the bromine atoms is bonded only to benzene rings, which can be produced by polymerizing brominated styrenic monomer in which all of the bromine atoms is bonded only to benzene rings.

It is allowable that the bromine atoms bonded to the portion outside benzene rings as impurities be contained in the aforesaid brominated polystyrene to the extent that the amount of bromine atoms contained in bromine compounds generated at the time when said polystyrene is allowed to stand in an atmosphere of 300° C. for 15 minutes is at most 1000 ppm by weight based on the total amount of bromine atoms contained in said polystyrene.

The process for producing the halogenated polystyrene to be used as the component (B) is not specifically limited, but may be in accordance with a process wherein halogenated styrenic monomer in which all of the halogen atoms is bonded only to benzene rings is homopolymerized or copolymerized with another comonomer, a process wherein styrenic polymer is halogenated or a process wherein the above-produced halogenated polystyrenes are blended. Of these, there is preferably adopted a method wherein halogenated styrenic monomer in which all of the halogen atoms is bonded only to benzene rings is homopolymerized.

In the present invention, the halogenated polystyrene as the component (B) is blended in an amount of 2 to 100 parts by weight based on 100 parts by weight of the resin as the component (A). An amount thereof less than 2 parts by weight leads to insufficient flame retardative performance, whereas that more than 100 parts by weight results in failure to enhance the effect on flame retardative performance in proportion to the blended amount and besides in deterioration of the mechanical properties of the objective composition. The blending amount of the component (B) is in the range of preferably from 5 to 100, more preferably 10 to 80 parts by weight based on the above from the viewpoints of both flame retardative performance and mechanical properties.

The flame retardant aid to be employed as the component (C) in the flame retardative resin composition is not specifically limited, but may be selected for use from the compounds which have heretofore been customarily used as flame retardant aid for polystyrene. Examples of such flame retardant aid include antimony oxide such as antimony trioxide and antimony pentaoxide; alkali metal salts of antimonic acid such as sodium antimonate; antimony-based flame retardant aid such as alkaline earth metal salts of antimonic acid, metallic antimony, antimony trichloride, antimony pentachloride, antimony trisulfide and antimony pentasulfide; zinc borate; barium metaborate; zirconium oxide; iron oxide and zinc oxide. Of these, there are preferably used antimony oxide, alkali metal salts of antimonic acid, alkaline earth metal salts of antimonic acid, iron oxide and zinc oxide from the standpoints of performance and economical efficiency. In particular, diantimony trioxide is preferable among them.

The flame retardant aid may be used alone or in combination with at least one other. The blending amount thereof is selected in the range of from 1 to 10 expressed in terms of the component (B)/the component (C). An amount thereof exceeding 10 causes insufficiency in the effect as a flame retardant aid, whereas that less than 1 results in failure to enhance the effect as a flame retardant aid in proportion to the blended amount and besides in deterioration of other properties of the objective composition.

The above-mentioned flame retardative resin composition according to the present invention may be blended with an organic filler or an inorganic filler as the component (D) for the purpose of enhancing the rigidity, insulation properties, chemical resistance and the like of the objective composition. There are preferably used an organic filler or an inorganic filler each surface-treated with a coupling agent to enhance adhesivity to the resin component.

As the inorganic filler, mention is made of various fillers such as fibrous filler, granular filler and powdery filler. Examples of fibrous filler include glass fiber, whisker and ceramics fiber. Specific examples of the filler include boron; alumina; silica and silicon carbide as whisker, gypsum; metal salts of titanic acid; magnesium sulfate; and magnesium oxide as ceramics fiber. Among the above-mentioned fillers are preferable in particular, the glass fillers such as glass filament, glass fiber, glass roving and glass mat. The form or shape of the filler includes bound and cut fiber, short fiber, filament and whisker. The bound and cut fiber has preferably a length of 0.05 to 50 mm and a diameter of 5 to 20 µm.

Examples of granular or powdery filler include talc, carbon black, graphite, titanium dioxide, fused or crystalline silica, mica, calcium carbonate, calcium sulfate, barium carbonate, magnesium carbonate, magnesium sulfate, barium sulfate, oxysulfate, tin oxide, alumina, kaolin, silicon carbide, glass powder, glass flake and glass bead. Among the above fillers are preferable in particular, calcium carbonate, mica, glass powder, glass flake and glass beads.

Examples of the organic filler to be used as the component (D) include fluororesin and aramid resin fiber.

As the surface-treated organic or inorganic filler, citation is made of a filler which is surface treated with a coupling agent usually used for a surface treatment, for example, a silane-based coupling agent, a titanium-based coupling agent or the like, which are specifically exemplified by those used for the surface treatment of the glass cloth as described hereinafter.

The surface treatment of the above-mentioned organic or inorganic filler by the use of such coupling agent can be effected by a conventional known method without specific limitation, for example, sizing treatment in which the filler is coated with the sizing agent in the form of solution of the coupling agent as mentioned above in an organic solvent or in the form of suspension containing the coupling agent; dry blending by the use of a Henschel mixer, super mixer, Ready-gel mixer, V-type blender or the like; spraying method; integral blending; dry concentration or the like, each being suitably selected according to the form and shape of the filler to be used. The surface treatment is, however, preferably carried out by means of sizing treatment, dry blending, spraying or the like.

In combination with the aforementioned coupling agent, a film-forming substance for glass may be used without specific limitation and is exemplified by the polymer such as polyester-based, polyether-based, urethane-based, epoxy-based, acrylics-based, and vinyl acetate-based polymers.

The organic filler or inorganic filler may be used alone or in combination with at least one other.

In the case of blending the organic or inorganic filler in the present composition, the blending amount thereof is set to 0 to 350, preferably to at most 250 parts by weight based on 100 parts by weight of the present resin as the component (A).

An amount thereof more than 350 parts by weight causes a tendency to lower the toughness and impact resistance of the objective product as well as the impregnation of the resin into the glass cloth, whereas that less than 1 part by weight results in failure to sufficiently exert the effect on enhancing the mechanical properties such as tensile strength of the objective product. Thus, the blending amount of the organic filler or the inorganic filler is 1 to 350, preferably 5 to 300, particularly preferably 10 to 250 parts by weight from the viewpoints of mechanical properties such as tensile strength, toughness and impact resistance each of the objective product.

The above-described flame retardative resin composition may be incorporated as necessary with any of various additives such as a halogen scavenger, a stabilizer, an antioxidant, a nucleating agent, a light stabilizer, a lubricant, a plasticizer, an antistatic agent, a mold release agent, a colorant and a thermoplastic resin other than the components of the present resin composition insofar as the object of the invention is not impaired thereby.

The halogen scavenger is intended to enhance the heat stability of the halogenated polystyrene as a flame retardant and the component (B) and also improve the corrosion resistance of a mold and retention stability of the objective composition, and is preferably exemplified by hydrotalcite.

As the nucleating agent, general organic nucleating agents and inorganic nucleating agents can be used, and are exemplified by a metal salt of a carboxylic acid such as a metal salt of di-p-tert-butylbenzoic acid, a sodium salt of a cyclohexane-carboxylic acid and a sodium salt of β-naphthoic acid; and an organophosphorus compound such as a metal salt of phosphoric acid 2,2'-methylenebis(4,6-di-tert-butylphenyl).

Examples of the antioxidant include pentaerythrityl-tetrakis[3-(3,5-di-tert-butyl-4-hydroxyphenyl)propionate], n-octadecyl-3-(3,5-di-tert-butyl-4-hydroxyphenyl) propionate and (2,6-di-tert-butyl-4-methylphenyl) pentaerythritol-diphosphite.

Examples of the light stabilizer include hindered amine-based compound such as di-(2,2,6,6-tetramethyl-4-piperidyl)sebacate; 4-benzoyloxy-2,2,6,6-tetramethylpiperidine; and 1,2,3,4-tetra-(2,2,6,6-tetramethyl-4-piperidyl)butanetetracarboxylate and benzotriazole-based compound such as 2-(2-hydroxy-5-methylphenyl)benzotriazole; 2-(2-hydroxy-5-tert-butylphenyl)benzotriazole; and 2-(2-hydroxy-3,5-di-tert-butylphenyl)benzotriazole.

Examples of the lubricant include a fatty acid such as stearic acid and behenic acid, metal salts of fatty acids such as zinc stearate, calcium stearate and magnesium stearate, and ethylenebisstearamide. Examples of the plasticizer include polyethylene glycol, polyamide oligomer, phthalic acid ester, polystyrene oligomer, polyethylene wax, mineral oil and silicone oil.

The process for preparing the above-described flame retardative resin composition is not specifically limited, but may be selected from the well known processes. For example, the resin composition can be prepared by blending the above-mentioned components (A), (B), (C) and (D) and, as necessary, any of various additives each in a prescribed proportion and melt kneading the resulting blend at a temperature in the range of 270° to 320° C. by means of a Banbury mixer, a single-screw extruder, a twin-screw extruder, a cokneader, a multi-screw extruder or the like.

The prepreg for a printed circuit board according to the present invention is produced by impregnating a glass cloth with the flame retardative resin composition prepared in the above-described manner.

The method of weaving into cloth is not specifically limited, but may be optionally selected from plain weaving, twill weaving, narrowing plain weaving and the like. Of these, plain weaving is favorable for its easiness of surface smoothness. There is no limitation in particular, on the thickness of a glass cloth layer and the ratio of glass cloth thickness to the thickness of the whole prepreg or the whole substrate for printed circuit.

The amount of the glass cloth necessary and used for the preparation of the prepreg for a printed circuit board is at least 1%, preferably at least 10% by weight based on the total weight of the prepreg. An amount thereof less than 1% brings about a decrease in the rigidity of a laminate for a printed circuit board when heated. It is also necessary that the amount of the glass cloth to be used be at most 95%, preferably at most 80% by weight based on the total weight of the prepreg. An amount thereof more than 95% by weight unfavorably causes tendencies of a molding material for the prepreg to become porous and lose the strength.

In accordance with the amount of the glass cloth to be used as described above, the amount of the aforestated flame retardative resin composition to be used for the preparation of the prepreg for a printed circuit board is in the range of 5 to 99%, preferably 20 to 99% by weight based on the total weight of the prepreg.

Preferably, the aforesaid glass cloth to be used in the present invention is surface-treated with a coupling agent. The coupling agent may be optionally selected for use from the well-known silane-based coupling agents and titanium-based coupling agents. Examples of the silane-based coupling agent include triethoxysilane, vinyltris(β-methoxyethoxy)silane, γ-methacryloxypropyl-trimethoxysilane, γ-glycidoxypropyl-trimethoxysilane, β-(1,1-epoxycyclohexyl)ethyl-trimethoxysilane, N-β-(aminoethyl)-γ-aminopropyl-trimethoxysilane, N-β-(aminoethyl)-γ-aminopropyl-methyldimethoxysilane, γ-aminopropyl-triethoxysilane, N-phenyl-γ-aminopropyl-trimethoxysilane, γ-mercaptopropyl-trimethoxysilane, γ-chloropropyl-trimethoxysilane, γ-aminopropyl-trimethoxysilane, γ-aminopropyl-tris(2-methoxyethoxy)silane, N-methyl-γ-aminopropyl-trimethoxysilane, N-vinylbenzyl-γ-aminopropyl-triethoxysilane, triaminopropyl-trimethoxysilane, 3-ureidopropyl-trimethoxysilane, 3-(4,5-dihydroimidazole)propyl-triethoxysilane, hexamethyldisilazane, N,O-(bistrimethylsilyl)amide and N,N-bis(trimethylsilyl) urea.

Among them are desirable aminosilane and epoxysilane such as

γ-aminopropyl-triethoxysilane,

N-β-(aminoethyl)-γ-aminopropyl-triethoxysilane,

γ-glycidoxypropyltrimethoxysilane, and

β-(3,4-epoxycyclohexyl)ethyltrimethoxysilane.

Specific examples of the titanium-based coupling agent include isopropyltriisostearoyl titanate, isopropyltridodecyl-benzenesulfonyl titanate, isopropyltris(dioctylpyrophosphate)titanate, tetraisopropylbis(dioctylphosphite)titanate, tetraoctylbis(di-tridecylphosphite)titanate, tetra(1,1-diallyloxymethyl-1-butyl)bis(ditridecyl)phosphite titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropylisostearoyldiacrylate titanate, isopropyltri(dioctylphosphate)titanate, isopropyltricumylphenyl titanate, isopropyltri(N-amidoethyl-aminoethyl)titanate, dicumylphenyloxyacetate titanate and diisostearoyl-ethylene titanate, among which isopropyltri(N-amidoethyl-aminoethyl)titanate is desirable.

The surface treatment of the above-mentioned glass cloth by the use of such coupling agent can be effected by a conventional known method without specific limitation, for example, sizing treatment in which the glass cloth is coated with the sizing agent in the form of solution of the coupling agent as mentioned above in an organic solvent or in the form of suspension containing the coupling agent.

In combination with the aforementioned coupling agent, a film-forming substance for glass may be used without specific limitation and is exemplified by the polymer such as polyester-based, polyether-based, urethane-based, epoxy-based, acrylics-based, and vinyl acetate-based polymers.

The method of impregnating the glass cloth with the flame retardative resin composition is not specifically limited, but may be optionally selected from known methods. For example, the prepreg for a printed circuit board according to the present invention can be produced by dry blending the components for the flame retardative resin composition; pelletizing the resulting blend by a conventional method; then extruding the resulting pellet into a molding material in the form of sheet; and impregnating the glass cloth with the resultant molding material by means of continuous compression molding, compression molding or the like. By the term "continuous compression molding" as used herein is meant a method in which several layers of a molding material in the form of sheet and glass cloth are inserted between a pair of metallic rolls, heat melted, and then cooled into a laminated product. The compression molding method is a method in which a molding material along with glass cloth are charged in a mold and made into a laminated product under pressure. In addition, the resin composition can be impregnated into the glass cloth by extruding a starting material for the resin composition into the form of film by means of T-dye extrusion method, while processing the film and glass cloth between rolls through heating, compressing and cooling with a double belt press or a single belt press.

An excellent substrate for printed circuit is obtained by attaching a metallic layer onto the prepreg for a printed circuit board according to the present invention. There are usable single prepreg and also a laminated product having at least two such prepregs laminated onto each other. The metallic layer can be laminated on one side or both sides of either of the above-mentioned single prepreg or the laminated product having at least two prepregs. Examples of usable metallic layers include thin films of copper, aluminum, silver, gold, zinc and tin. The metallic layer is preferably a copper layer or an aluminum layer, particularly preferably a copper layer, which is made into a copper laminated product for preferable use in the present invention.

A variety of methods are available for the production of the substrate for printed circuit and are exemplified by a ① method in which the present prepreg or the laminated product having at least two such prepregs which has been prepared in advance is laminated with a metallic layer by the use or nonuse of an adhesive, a ② method in which a metallic layer is laminated on the present prepreg simultaneously with the preparation of the prepreg without using an adhesive, and the like method.

In the case of simultaneously laminating a molding material in the form of sheet, glass cloth and a metallic layer by the above-mentioned method ②, it is advisable that the aforesaid three components be charged in a mold and subjected to compression molding.

Alternatively, a laminated product can be produced by dry blending the components for the flame retardative resin composition; pelletizing the resultant blend by a conventional method; then extruding the resultant pellet into sheet for molding the prepreg; inserting several layers of the resultant sheet and glass cloth between a pair of metallic belts while feeding metallic foil or foils along one or both sides of the combination of the sheet and glass cloth; and processing through heat melting followed by cooling to directly form a metal-laminated product. This molding method can be continuously carried out along with sheet molding for prepreg molding by means of extrusion molding.

The substrate for printed circuit according to the present invention, which is made from the prepreg for a printed circuit board, is greatly improved in characteristic resistance to electrolytic corrosion and imparted with high reliability by decreasing ions and moisture present in a laminated sheet, thus enabling itself to cope with the commercial devices requiring high density.

Accordingly, the prepreg and substrate of the present invention are well suited to use for not only the production of printed circuit board, but also general construction materials, electric and/or electronic parts, car parts and further raw materials for films, fibers and sheets.

In the following, the present invention will be described in more detail with reference to comparative examples and working examples, which however shall not be construed to limit the present invention thereto. Each of the components used in the preparation of the flame retardative resin composition is detailed as follows.

(A) Component (a)

SPS: having a weight-average molecular weight (Mw) of 225,000 approx. expressed in terms of polystyrene as determined by GPC in 1,2,4-trichlorobenzene as the solvent at 150° C., and weight-average molecular weight/number-average molecular weight (Mw/Mn) of 2.70.

(A) Component (b)

MA-PPE: maleic anhydride-modified poly(phenylene ether) prepared in Preparation Example 1.

(A) Component (c)

G1651: SEBS produced by Shell Chemical Co., Ltd., under the trade name; Kraton G-1651

(B) Brominated polystyrene poly(MBS): monobromostyrene polymer (Mw of 203,000, Br content of 43.6% by weight, Br generation amount at 300° C. after 15 minutes standing of 50 ppm by weight), obtained by polymerizing, at 60° C. in toluene, 4 mol/liter monobromostyrene (produced by Aldorich Co., Ltd.) using 8.84 mmol/liter azobis (isobutyronitrile) (AIBN)

poly(DBS): dibromostyrene polymer (Mw of 199,000, Br content of 61.0% by weight, Br generation amount at 300° C. after 15 minutes standing of 55 ppm by weight), obtained by polymerizing, at 60° C. in toluene, 2 mol/liter dibromostyrene (synthesized and purified by the method described in Nippon Kagaku Kaishi [Journal of Japan Chemical Association] 1992, page 633) using 9.19 mmol AIBN.

poly(TBS): tribromostyrene polymer (Mw of 211,000, Br content of 70.3% by weight, Br generation amount at 300° C. after 15 minutes standing of 80 ppm by weight), obtained by polymerizing, at 60° C. in toluene, 0.8 mol/liter tribromostyrene (FR803 produced by Bromochem Far East Co., Ltd., purified with methanol) using 4.61 mmol AIBN.

PDBS-80: brominated polystyrene (produced by Great Lake Co., Ltd.) (Mw of 54,000, Br content of 59.0% by weight, Br generation amount at 300° C. after 15 minutes standing of 250 ppm by weight).

Brominated polystyrene with less amount of Br generation has been shown hereinbefore, and that with more amount of Br generation will be shown hereinafter.

Br-poly(TBS): brominated polystyrene (Mw of 210,000, Br content of 71.1% by weight, Br generation amount at 300° C. after 15 minutes standing of 8100 ppm by weight), obtained by adding bromine to the aforesaid poly(TBS) at the chain portion by the method described in Polymer Journal vol. 26, No. 7 (1994) page 823.

Pyrocheck 68 PB (68 PBC): brominated polystyrene produced by Nissan Ferro Co., Ltd. (Mw of 24,100, Br content of 67.0% by weight, Br generation amount at 300° C. after 15 minutes standing of 5200 ppm by weight).

The amount of bromine generation was determined by the following way.

10 g of brominated polystyrene was placed in a one liter (L) glass vessel, followed by sealing the vessel and heated at 300° C. for 15 minutes. Then, generated internal gas was blown into 100 milliliter (mL) of pure water through bubbling to dissolve bromine compounds therein, which was determined by titration. On the basis of the result of titration, the amount of bromine generation (Bg) was calculated by the formula Bg (ppm)=(amount of bromine thus determined)/(bromine content in brominated polystyrene)×1,000,000.

(C) Component (C)

ATOX-S: antimony trioxide produced by Nihon Seiko Co., Ltd. under the trade name "ATOX-S"

(D) Component (D)

Lublon L2: tetrafluoroethylene resin produced by Daikin Industries, Ltd. under the trade name "Lublon L2"

FB74: fused silica produced by Denki Kagaku Kogyo K.K. under the trade name "FB74"

Miscellaneous additives

Irganox 1010: pentaerythrityl-tetrakis[3-(3,5-di-tertbutyl-4-hydroxyphenyl)propionate as antioxidant produced by Ciba Geigy Co., Ltd. under the trade name "Irganox 1010"

DHT-4A: basic aluminum/magnesium carbonate hydrate as halogen scavenger, produced by Kyowa Chemical Industries Co., Ltd. under the trade name "DHT-4A"

PREPARATION EXAMPLE 1

One (1) kg of poly(phenylene ether) (intrinsic viscosity of 0.47 dl/g in chloroform at 25° C.), 60 g of maleic anhydride, and 10 g of 2,3-dimethyl-2,3-diphenylbutane (produced by Nippon Oil & Fats Co., Ltd. under the trade name "NOPHMER") as a radical generating agent were dry-blended and melt kneaded by the use of a 30 mm twin-screw extruder at a revolution of 200 rpm at a temperature set to 300° C., while the resin temperature was about 330° C. The resultant strand was cooled and then pelletized to produce maleic anhydride-modified poly(phenylene ether). In order to measure the modification efficiency, one (1) g of the resultant modified poly(phenylene ether) was dissolved in ethylbenzene and then reprecipitated in methanol, and the recovered polymer was subjected to Soxhlet extraction and dried. Thereafter, the modification efficiency was determined from the intensity of carbonyl absorption in infrared (IR) absorption spectrum. As a result, the modification efficiency was 2.0% by weight.

EXAMPLE 1

Glass cloth having a unit weight of 210 g/cm$^2$ and a thickness of 180 μm which had been surface treated with a silane-based coupling agent (produced by Asahi Shuabel Co., Ltd. Model 7628) was sandwiched between two films which had been formed by extrusion molding of the resin compound composed of the components (A), (B) and (C) and the other additives as shown in Table 1 in such an amount that the blending proportion thereof becomes the value as given in Table 1 based on the whole amount of the prepreg, and the resultant sandwich was pressed with a heating press under the conditions of 300° C., 60 kg/cm$^2$ and 180 sec to impregnate the resin into the glass cloth and thus afford the prepreg.

Four sheets of the resultant prepregs were superimposed upon one another. The resultant four-layer product was put between two copper foils each with 18 μm thickness and pressed under the conditions of 280° C., 60 kg/cm$^2$ and 60 sec to afford a double sided copper-laminated sheet.

Evaluation was made of the flame retardancy and resistance to electrolytic corrosion of the copper-laminated sheet thus obtained by carrying out the combustion test and electrolytic corrosion test through the methods described as follows.

(1) Flame retardancy

According to UL94, 5 pieces of molded test pieces each of 5 inch length by ½ inch width by 1/32 inch thickness were subjected to combustion test to evaluate flame retardancy by classifying the results into V-0, V-1, V-2 and HB.

(2) Resistance to electrolytic corrosion

Comb-shaped pattern as detailed hereunder was formed on the laminated sheet by means of etching. Subsequently, the sheet was subjected to electrolytic corrosion test under the moisture resistant load conditions of 20 V impressed voltage, 60° C. temperature and 95% R.H. to evaluate the change in external appearance, during which time electric current was measured under the same conditions to evaluate the period of time until the current reaches 5 mA and substantial short-circuit state.

| Comb-shaped pattern | |
| --- | --- |
| Conductor width | 0.25 mm |
| Conductor spacing | 0.10 mm |
| Conductor length | 100 mm |
| Number of conductors | 50 |
| Resist coating | Yes |

The results of the above items (1) and (2) are given in Table 1.

EXAMPLES 2 TO 10 AND COMPARATIVE EXAMPLES 1-5

In the same manner as in Example 1, copper-laminated sheets were prepared according to the blending compositions as given in Table 1 to evaluate the performance. The results are given in Table 1.

TABLE 1-1

| | | | Example | | | |
| --- | --- | --- | --- | --- | --- | --- |
| | | | 1 | 2 | 3 | 4 |
| Blending composition (parts/parts by weight)*2 | (A)*1 | (a) SPS | 100 | 100 | 100 | 96 |
| | | (b) MAPPE | — | — | — | 4 |
| | | (c) Other resin | — | — | — | — |
| | (B) | Brominated polystyrene | poly (TBS) 22.79 | poly (DBS) 26.23 | poly (MBS) 36.70 | poly (DBS) 26.23 |
| | (C) | ATOX-S | 4.3 | 4.3 | 4.3 | 4.3 |
| | (D) | Organic or inorganic filler | — | — | — | — |
| | Others | Additive (1) | Irganox 1010 0.5 | Irganox 1010 0.5 | Irganox 1010 0.5 | Irganox 1010 0.5 |
| | | Additive (2) | — | — | — | — |
| Glass cloth (% by weight)*3 | | | 50 | 50 | 50 | 50 |
| Evaluation | Flame retardancy | | V-0 | V-0 | V-0 | V-0 |
| | Resistance to electrolytic corrosion (Hr) | | 3000≦ | 3000≦ | 3000≦ | 3000≦ |

*1The blending proportion of each of the components (a), (b) and (c) in component (A) is expressed in % by weight based on the whole amount of (A), that is, (a) + (b) + (c).
*2The blending proportion of each of the components (B), (C), (D) and other additives is expressed in part/parts by weight based on 100 parts by weight of the component (A).
*3The blending proportion of the glass cloth is expressed in % by weight based on the whole amount of prepreg.

TABLE 1-2

| | | | Example | | | |
|---|---|---|---|---|---|---|
| | | | 5 | 6 | 7 | 8 |
| Blending composition (part/parts by weight)*² | (A)*¹ | (a) SPS | 86 | 76 | 96 | 86 |
| | | (b) MA-PPE | 4 | 4 | 4 | 4 |
| | | (c) Other resin | G1651 10 | G1651 20 | — | G1651 10 |
| | (B) | Brominated polystyrene | PDBS-80 26.23 | poly (TBS) 40.00 | PDBS-80 30.00 | PDBS-80 40.00 |
| | (C) | ATOX-S | 4.3 | 6.0 | 3.2 | 6.0 |
| | (D) | Organic or inorganic filler | — — | — — | Lublon L2 20 | FB 74 200 |
| | Others | Additive (1) | Irganox 1010 0.5 | Irganox 1010 0.5 | Irganox 1010 0.5 | Irganox 1010 0.5 |
| | | Additive (2) | DHT-4A 0.5 | DHT-4A 1.0 | DBT-4A 0.5 | DHT-4A 1.0 |
| Glass cloth (% by weight)*³ | | | 60 | 30 | 50 | 35 |
| Evaluation | Flame retardancy | | V-0 | V-0 | V-0 | V-0 |
| | Resistance to electrolytic corrosion (Hr) | | 3000≦ | 3000≦ | 3000≦ | 3000≦ |

*¹The blending proportion of each of the components (a), (b) and (c) in component (A) is expressed in % by weight based on the whole amount of (A), that is, (a) + (b) + (c).
*²The blending proportion of each of the components (B), (C), (D) and other additives is expressed in part/parts by weight based on 100 parts by weight of the component (A).
*³The blending proportion of the glass cloth is expressed in % by weight based on the whole amount of prepreg.

TABLE 1-3

| | | | Example | | Comparative Example | |
|---|---|---|---|---|---|---|
| | | | 9 | 10 | 1 | 2 |
| Blending composition (part/parts by weight)*² | (A)*¹ | (a) SPS | 86 | 86 | 100 | 100 |
| | | (b) MA-PPE | 4 | 4 | — | — |
| | | (c) Other resin | G1651 10 | G1651 10 | — | — |
| | (B) | Brominated polystyrene | PDBS-80 40.00 | PDBS-80 60.00 | — | Br-poly (TBS) 22.50 |
| | (C) | ATOX-S | 6.0 | 6.0 | — | 4.3 |
| | (D) | Organic or inorganic filler | — | — | — | — |
| | Others | Additive (1) | Irganox 1010 0.5 | Irganox 1010 0.3 | Irganox 1010 0.5 | Irganox 1010 0.5 |
| | | Additive (2) | DHT-4A 1.0 | DHT-4A 1.0 | — | — |
| Glass cloth (% by weight)*³ | | | 70 | 40 | 50 | 50 |
| Evaluation | Flame retardancy | | V-0 | V-0 | HB | V-0 |
| | Resistance to electrolytic corrosion (Hr) | | 3000≦ | 3000≦ | 3000≦ | 340 |

*¹The blending proportion of each of the components (a), (b) and (c) in component (A) is expressed in % by weight based on the whole amount of (A), that is, (a) + (b) + (c).
*²The blending proportion of each of the components (B), (C), (D) and other additives is expressed in part/parts by weight based on 100 parts by weight of the component (A).
*³The blending proportion of the glass cloth is expressed in % by weight based on the whole amount of prepreg.

TABLE 1-4

|  |  |  | Comparative Example | | |
|---|---|---|---|---|---|
|  |  |  | 3 | 4 | 5 |
| Blending composition (part/parts by weight)*² | (A)*¹ | (a) SPS | 86 | 86 | 86 |
|  |  | (b) MA-PPE | 4 | 4 | 4 |
|  |  | (c) Other resin | G1651 10 | G1651 10 | G1651 10 |
|  | (B) | Brominated polystyrene | Br-poly (TBS) 31.00 | Pyrocheck 68PB 33.00 | PDBS-80 40.00 |
|  | (C) | ATOX-S | 4.3 | 6.7 | 50.0 |
|  | (D) | Organic or inorganic filler | — | — | — |
|  | Others | Additive (1) | Irganox 1010 0.5 | Irganox 1010 0.5 | Irganox 1010 0.5 |
|  |  | Additive (2) | DHT-4A 1.0 | DHT-4A 1.0 | DHT-4A 1.0 |
| Glass cloth (% by weight)*³ | | | 60 | 55 | 40 |
| Evaluation | Flame retardancy | | V-0 | V-0 | V-0 |
|  | Resistance to electrolytic corrosion (Hr) | | 410 | 720 | 2300 |

*¹The blending proportion of each of the components (a), (b) and (c) in component (A) is expressed in % by weight based on the whole amount of (A), that is, (a) + (b) + (c).
*²The blending proportion of each of the components (B), (C), (D) and other additives is expressed in part/parts by weight based on 100 parts by weight of the component (A).
*³The blending proportion of the glass cloth is expressed in % by weight based on the whole amount of prepreg.

As can be seen from Table 1, the substrates for printed circuit comprising the prepreg of the present invention (Examples 1 to 10) are entirely excellent in flame retardancy and resistance to electrolytic corrosion, whereas in Comparative Examples 2–4 in which were blended flame retardants wherein the amount of halogen (bromine) generation exceeded 1000 ppm by weight at 300° C. after 15 minutes standing, resistance to electrolytic corrosion is poor. That is to say, bromine is eliminated at a temperature of resin molding to react with copper foils into copper bromide, which is partially dissolved in water present among the conductors on the surface of the prepreg, in an atmosphere of high humidity of 95% R.H. Thus, ionization occurs, making electric current more apt to flow when voltage is applied to the prepreg.

What is claimed is:

1. A prepreg for a printed circuit board, which comprises 5 to 99% by weight of a flame retardative resin composition and 1 to 95% by weight of a glass cloth impregnated therewith, said resin composition comprising 100 parts by weight of (A) a resin composed of 10 to 100% by weight of a (a) styrenic polymer having syndiotactic configuration; 2 to 100 parts by weight of a (B) halogenated polystyrene in which the amount of halogen atoms contained therein generated at the time when said halogenated polystyrene is allowed to stand in an atmosphere of 300° C. for 15 minutes is at most 1000 ppm by weight based on the total amount of halogen atoms contained in said halogenated polystyrene; a (C) flame retardant aid in a proportion of 1 to 10 expressed in terms of the ratio of said component (B)/ said component (C); and 0 to 350 parts by weight of an (D) organic filler or inorganic filler.

2. The prepreg according to claim 1, which further comprises 0 to 10% by weight of a (b) polymer having compatibility with or affinity for said component (a), said polymer (b) being selected from the group consisting of syndiotactic polystyrene, atactic polystyrene, isotactic polystyrene, styrene polymer, styrenic copolymer, poly(phenylene ether) and poly(vinyl ethyl ether) in a main, block or graft chain thereof, and further containing a polar group.

3. The prepreg according to claim 1, which further comprises 0 to 90% by weight of (c) thermoplastic resin other than said components (a) and (b) or a rubbery elastomer or a mixture thereof.

4. The prepreg according to claim 1, which further comprises 0 to 10% by weight of a (b) polymer having compatibility with or affinity for said component (a), said polymer (b) being selected from the group consisting of syndiotactic polystyrene, atactic polystyrene, isotactic polystyrene, styrene polymer, styrenic copolymer, poly(phenylene ether) and poly(vinyl ethyl ether) in a main, block or graft chain thereof, and further containing a polar group; and 0 to 90% by weight of a (c) thermoplastic resin other than said components (a) and (b) or a rubbery elastomer or mixture thereof.

5. The prepreg according to claim 1 wherein the halogenated polystyrene as the component (B) contains at least 30% by weight of halogen atoms.

6. The prepreg according to claim 1 wherein the halogenated polystyrene as the component (B) is a halogenated polystyrene in which substantially all of the halogen atoms is bonded only to benzene rings.

7. The prepreg according to claim 5 wherein the halogenated polystyrene as the component (B) is a halogenated polystyrene in which substantially all of the halogen atoms is bonded only to benzene rings.

8. The prepreg according to claim 1 wherein the halogenated polystyrene as the component (B) is a brominated polystyrene in which substantially all of the bromine atoms is bonded only to benzene rings.

9. The prepreg according to claim 5, wherein the halogenated polystyrene as the component (B) is a brominated polystyrene in which substantially all of the bromine atoms is bonded only to benzene rings.

10. The prepreg according to claim 1 wherein the flame retardant aid as the component (C) is at least one member selected from the group consisting of antimony oxide, alkali metal salts of antimonic acid, alkaline earth metal salts of antimonic acid, iron oxide and zinc oxide.

11. The prepreg according to claim 5, wherein the flame retardant aid as the component (C) is at least one member selected from the group consisting of antimony oxide, alkali metal salts of antimonic acid, alkaline earth metal salts of antimonic acid, iron oxide and zinc oxide.

12. A substrate for printed circuit which comprises the prepreg for a printed circuit board as set forth in claim 1 or a laminate comprising a plurality of said prepregs laminated on each other, at least one side of the prepreg or the laminate being laminated with a metallic layer.

13. A substrate for printed circuit which comprises the prepreg for a printed circuit board as set forth in claim 5, or a laminate comprising a plurality of said prepregs laminated on each other, at least one side of the prepreg or the laminate being laminated with a metallic layer.

14. The substrate according to claim 1, wherein the metallic layer is a copper foil.

15. The substrate according to claim 13, wherein the metallic layer is a copper foil.

* * * * *